(12) United States Patent
Li et al.

(10) Patent No.: US 12,453,207 B2
(45) Date of Patent: Oct. 21, 2025

(54) IMAGE SENSOR AND METHOD FOR FORMING THE SAME

(71) Applicants: HUA HONG SEMICONDUCTOR (WUXI) LIMITED, Wuxi (CN); SHANGHAI HUAHONG GRACE SEMICONDUCTOR MANUFACTURING CORPORATION, Shanghai (CN)

(72) Inventors: Jialong Li, Wuxi (CN); Ziquan Fang, Wuxi (CN); Xiao Fan, Wuxi (CN); Han Wang, Wuxi (CN); Guanglong Chen, Wuxi (CN); Wensheng Qian, Wuxi (CN)

(73) Assignees: Hua Hong Semiconductor (WUXI) Limited, Wuxi (CN); Shanghai Huahong Grace Semiconductor Manufacturing Corporation, Shanghai (CN)

( * ) Notice: Subject to any disclaimer, the term of this patent is extended or adjusted under 35 U.S.C. 154(b) by 404 days.

(21) Appl. No.: 18/111,990

(22) Filed: Feb. 21, 2023

(65) Prior Publication Data
US 2023/0275164 A1 Aug. 31, 2023

(30) Foreign Application Priority Data
Feb. 28, 2022 (CN) .......................... 202210192656.2

(51) Int. Cl.
*H10F 77/16* (2025.01)
*H10F 39/18* (2025.01)
(Continued)

(52) U.S. Cl.
CPC ............. *H10F 77/16* (2025.01); *H10F 39/18* (2025.01); *H10F 71/121* (2025.01); *H10F 77/147* (2025.01)

(58) Field of Classification Search
CPC ........ H10F 77/16; H10F 39/18; H10F 71/121; H10F 77/147; H10F 39/014;
(Continued)

(56) References Cited

U.S. PATENT DOCUMENTS

| 2010/0229929 A1* | 9/2010 | Clifton .................... H10F 10/14 438/700 |
| 2022/0230909 A1* | 7/2022 | Li ..................... H01L 21/76224 |
| 2022/0246658 A1* | 8/2022 | Fan ..................... H10F 39/8057 |

FOREIGN PATENT DOCUMENTS

| CN | 112736102 A | * | 4/2021 | ........... H10F 39/026 |
| CN | 112736103 A | * | 4/2021 | ........... H10F 39/026 |

* cited by examiner

*Primary Examiner* — Earl N Taylor
(74) *Attorney, Agent, or Firm* — Boyle Fredrickson, S.C.

(57) ABSTRACT

An image sensor and a method for forming the image sensor are provided. The method includes: providing a substrate; patterning the substrate to form a plurality of columnar structures configured in an array, wherein a first trench, a second trench, and a third trench are configured between adjacent columnar structures and respectively along a first direction, a second direction, and a third direction, side walls of the columnar structures perpendicular to the first direction are (110) crystal faces, and oblique sections of the columnar structures perpendicular to the third direction are (100) crystal faces; and forming a doped epitaxial layer in the first trench, the second trench and the cross trench. Therefore, for the image sensor, an upper part of the cross trench is improved with little defects after the cross trench is full filled, which can effectively reduce white pixels and thus improve the performance of the image sensor.

18 Claims, 8 Drawing Sheets

(51) Int. Cl.
*H10F 71/00* (2025.01)
*H10F 77/14* (2025.01)

(58) Field of Classification Search
CPC ............ H10F 39/8027; H10F 39/8033; H10F 39/807; H10F 77/14; H10F 39/026; H10F 39/016; Y02P 70/50; H01L 31/035272; H01L 31/036; H01L 31/1804; H01L 31/035281; H01L 31/0368; H01L 27/14689; H01L 27/14687; H01L 27/14692; H01L 27/14643; H01L 27/1463; H01L 27/14632; H01L 27/14607; H01L 27/1461

See application file for complete search history.

ND METHOD FOR FORMING THE SAME

IMAGE SENSOR AND METHOD FOR FORMING THE SAME

CROSS-REFERENCE TO RELATED APPLICATIONS

This application claims the priority to Chinese Application No. 202210192656.2, filed on Feb. 28, 2022, and entitled "IMAGE SENSOR AND METHOD FOR FORMING THE SAME", the content of which is incorporated herein by reference in their entirety.

TECHNICAL FIELD

The present disclosure relates to the field of semiconductor manufacturing, and more particularly, to an image sensor and a method for forming the image sensor.

BACKGROUND OF THE INVENTION

Image sensors are semiconductor devices which can convert optical signals into electrical signals. CMOS Image Sensors (CIS) have been broadly applied in various fields due to low power consumption and high signal-to-noise ratio properties.

The most commonly used pixel unit in CMOS image sensors includes a photo diode (PD) and four metal oxide semiconductor (MOS) tubes. The pixel unit includes a transfer transistor (TX), a reset transistor (RST), a source follower transistor (SF), a row selection transistor (RS), and a floating diffusion region (FD), which can realize control of selection, reset, signal output, signal amplification and readout of the photo diode. The principle lies in that when light irradiates on the photo diode, photo-generated carriers are accumulated in the photo diode, then the transfer transistor is turned on through an external control circuit, and the photo-generated carriers flow from the photo diode to the floating diffusion region. The floating diffusion region works as a drain of the transfer transistor and also a PN junction capacitor, and the photo-generated carriers can be converted into output voltage signals in the floating diffusion region.

However, there are still some problems in processes for forming the CMOS image sensors in conventional technology.

SUMMARY OF THE INVENTION

According to some embodiments of the present disclosure, an image sensor and a method for forming the image sensor are provided to effectively reduce white pixels and improve images quality.

In some embodiments, the present disclosure provides a method for forming an image sensor. The method includes: providing a substrate which is doped with first ions; patterning the substrate to form a plurality of columnar structures configured in an array, wherein a first trench is configured between adjacent columnar structures which are configured along a first direction, a second trench is configured between adjacent columnar structures which are configured along a second direction, a cross trench is configured between adjacent columnar structures which are configured along a third direction, the first direction is perpendicular to the second direction, an included angle between the third direction and the first direction is 45°, an included angle between the third direction and the second direction is 45°, a side wall of each of the plurality of columnar structures perpendicular to the first direction is a (110) crystal face, and an oblique section of each of the plurality of columnar structures perpendicular to the third direction is a (100) crystal face; and forming a doped epitaxial layer in the first trench, in the second trench and in the cross trench, wherein the first trench, the second trench and the cross trench are filled with the doped epitaxial layer which is doped with second ions, and a conductivity of the second ions is different from a conductivity of the first ions.

According to some embodiment, the substrate is made of monocrystal silicon, and a surface of the substrate has a crystal direction of <110>.

According to some embodiment, the method further includes forming a mask material layer on the substrate before patterning the substrate. Patterning the substrate includes etching the mask material layer to remove a part of the mask material layer so as to form a mask layer.

According to some embodiment, a thickness of the mask material layer ranges from 100 nm to 800 nm.

According to some embodiment, the mask layer is different from the doped epitaxial layer in material, and the mask layer includes silicon oxide or silicon nitride.

According to some embodiment, forming the doped epitaxial layer includes: forming an epitaxial material layer in the first trench, in the second trench, in the cross trench, and on the mask layer; conducting a first planarization on the epitaxial material layer to form an initial doped epitaxial layer until the surface of the mask layer is exposed; removing the mask layer; and conducting a second planarization on the initial doped epitaxial layer to form the doped epitaxial layer until a top surface of each of the plurality of columnar structures is exposed.

According to some embodiment, the first planarization includes a chemical mechanical planarization.

According to some embodiment, the second planarization includes a chemical mechanical planarization.

According to some embodiment, the method further includes forming an intrinsic epitaxial layer on side walls of each of the plurality of columnar structures before forming the doped epitaxial layer. The doped epitaxial layer is formed on the intrinsic epitaxial layer.

According to some embodiment, the first ions are N-type ions, and the second ions are P-type ions.

According to some embodiment, the method further includes: after forming the doped epitaxial layer, forming a cover layer on the plurality of columnar structures and on the doped epitaxial layer.

According to some embodiment, forming the cover layer includes: forming a cover material layer on the plurality of columnar structures and on the doped epitaxial layer through an epitaxial growth process; and conducting a third planarization on the cover material layer to form the cover layer.

According to some embodiment, the third planarization includes a chemical mechanical planarization.

Accordingly, the present disclosure also provides a image sensor which includes: a substrate doped with first ions, which includes a plurality of columnar structures configured in an array, wherein a first trench is configured between adjacent columnar structures which are configured along a first direction, a second trench is configured between adjacent columnar structures which are configured along a second direction, a cross trench is configured between adjacent columnar structures which are configured along a third direction, the first direction is perpendicular to the second direction, an included angle between the third direction and the first direction is 45°, an included angle between the third direction and the second direction is 45°, a side wall of each of the plurality of columnar structures perpendicular to the first direction is a (110) crystal face, and an oblique section of each of the plurality of columnar structures perpendicular to the third direction is a (100) crystal face; and a doped epitaxial layer formed in the first trench, in the second trench and in the cross trench, wherein the first trench, the second trench and the cross trench are filled with the doped epitaxial layer which is doped with second ions, and a conductivity of the second ions is different from a conductivity of the first ions.

According to some embodiment, the substrate is made of monocrystal silicon, and a surface of the substrate has a crystal direction of <110>.

According to some embodiment, the image sensor further includes an intrinsic epitaxial layer disposed on side walls of each of the plurality of columnar structures. The doped epitaxial layer is disposed on the intrinsic epitaxial layer.

According to some embodiment, the first ions are N-type ions, and the second ions are P-type ions.

According to some embodiment, the image sensor further includes a cover layer on the plurality of columnar structures and on the doped epitaxial layer.

Compared with the conventional technology, the present disclosure has the following beneficial effects.

According to the method for forming an image sensor in some embodiments of the present disclosure, the side wall of each of the plurality of columnar structures perpendicular to the first direction is a (110) crystal face, and the oblique section of each of the plurality columnar structures perpendicular to the third direction is a (100) crystal face. Therefore, during a process for forming the doped epitaxial layer, the growth rate of the doped epitaxial layer formed in the first trench is greater than the growth rate of the doped epitaxial layer formed in the cross trench. That is, the first trench is full filled earlier than the cross trench. Then, a "cylinder" structure is gradually formed in the cross trench with the doped epitaxial layer continually filling into the cross trench. The "cylinder" structure in the cross trench is thus gradually full filled without forming a (111) crystal face which is easy to accumulate and produce dislocations at an upper part of the cross trench. Therefore, the upper part of the cross trench can be improved with little defects after the cross trench is full filled, which can effectively reduce white pixels and thus improve the performance of the image sensor.

Further, the method further includes: forming an intrinsic epitaxial layer on side walls of each of the plurality of columnar structures before forming the doped epitaxial layer. The doped epitaxial layer is disposed on the intrinsic epitaxial layer. The intrinsic epitaxial layer may be used to repair defects on side walls of the first trench, the second trench and the cross trench, which can improve the performance of the image sensor resulted.

According to the image sensor in some embodiments of the present disclosure, the side wall of each of the plurality of columnar structures perpendicular to the first direction is a (110) crystal face, and the oblique section of each of the plurality columnar structures perpendicular to the third direction is a (100) crystal face. Therefore, during a process for forming the doped epitaxial layer, the growth rate of the doped epitaxial layer formed in the first trench is greater than the growth rate of the doped epitaxial layer formed in the cross trench, that is, the first trench is full filled earlier than the cross trench. Then, a "cylinder" structure is gradually formed in the cross trench with the doped epitaxial layer continually filling into the cross trench. The "cylinder" structure in the cross trench is thus gradually full filled without forming a (111) crystal face which is easy to accumulate and produce dislocations at an upper part of the cross trench. Therefore, the upper part of the cross trench can be improved with little defects after the cross trench is full filled, which can effectively reduce white pixels and thus improve the performance of the image sensor.

Further, the image sensor further includes an intrinsic epitaxial layer disposed on side walls of each of the plurality of columnar structures. The doped epitaxial layer is disposed on the intrinsic epitaxial layer. The intrinsic epitaxial layer may be used to repair defects on side walls of the first trench, the second trench and the cross trench, which can improve the performance of the image sensor resulted.

DETAILED DESCRIPTION OF THE EMBODIMENTS

As mentioned in the background, there are still some problems in processes for forming the CMOS image sensors in conventional technology, which can be more fully appreciated with reference to the detailed description and accompanying drawings that follow.

FIG. 1 to FIG. 4 schematically illustrate intermediate structural diagrams according to a method for forming an image sensor in conventional technology. FIG. 5 schematically illustrate a diagram of a process for forming a doped epitaxial layer of the image sensor according to conventional technology.

Figure 1:
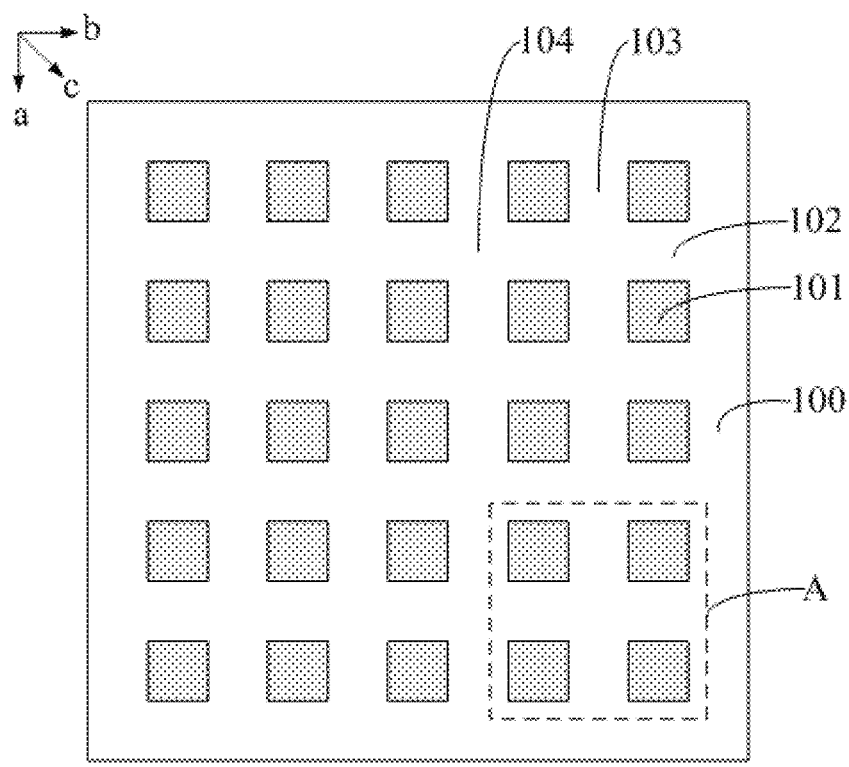
FIG. 1 to FIG. 4 schematically illustrate intermediate structural diagrams according to a method for forming an image sensor in conventional technology.
Figure 2:
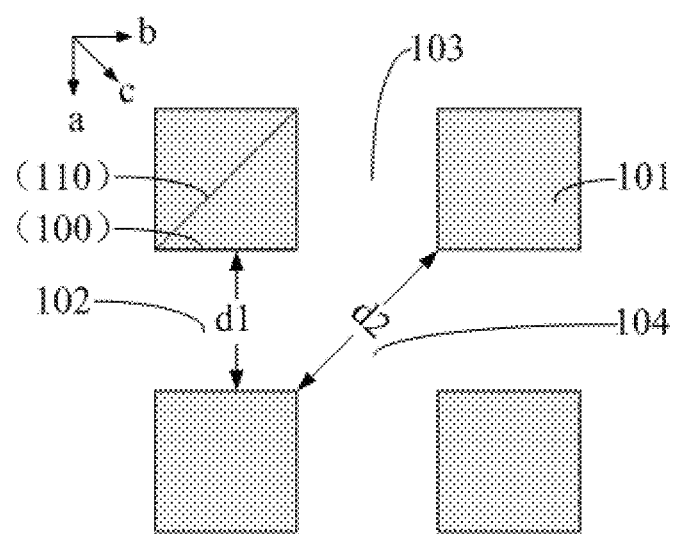

Referring to FIG. 1 and FIG. 2, FIG. 2 schematically illustrates an enlarged structural diagram of the part A in FIG. 1. A substrate 100 doped with first ions is provided. The substrate 100 is patterned to form a plurality of columnar structures 101 configured in an array. A first trench 102 is configured between adjacent columnar structures 101 which are configured along a first direction a. A second trench 103 is configured between adjacent columnar structures 101 which are configured along a second direction b. A cross trench 104 is configured between adjacent columnar structures 101 which are configured along a third direction c. The first direction a is perpendicular to the second direction b, an included angle between the third direction c and the first direction a is 45°, and an included angle between the third direction c and the second direction b is 45°. A side wall of each of the plurality of columnar structures 101 perpendicular to the first direction a is a (100) crystal face, and an oblique section of each of the plurality of columnar structures 101 perpendicular to the third direction c is a (110) crystal face.

Figure 3:
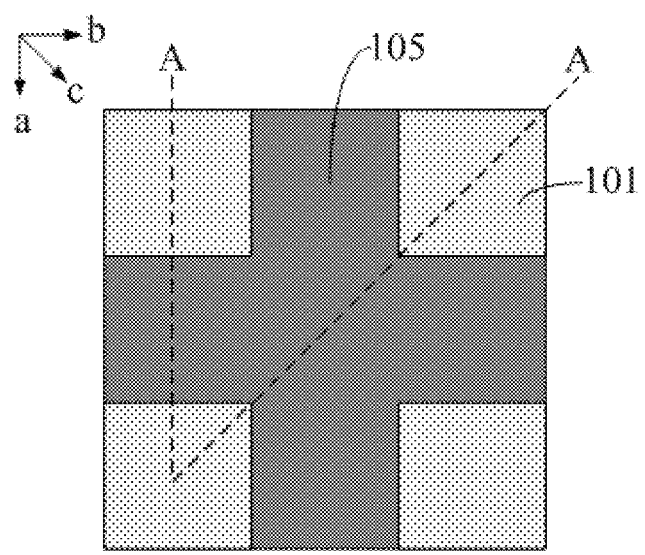
Figure 4:
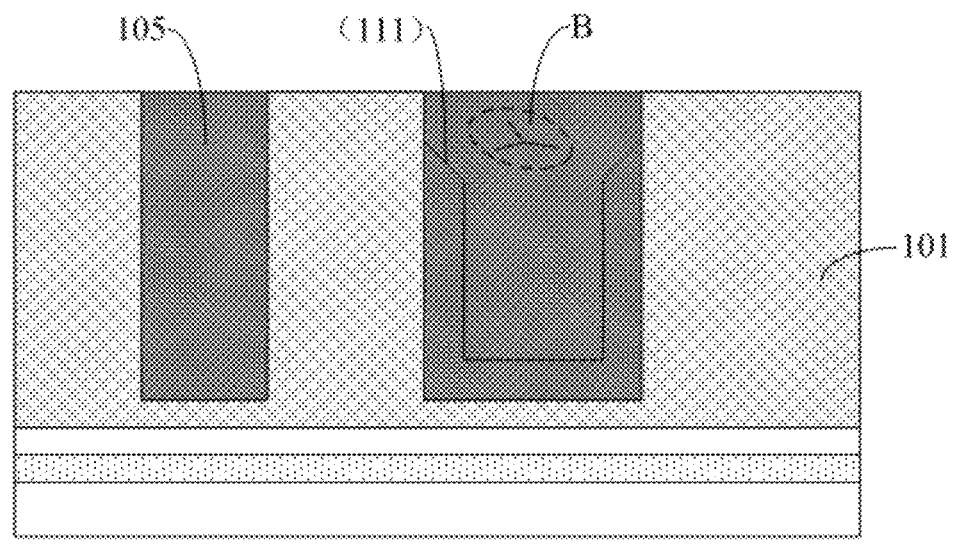
Figure 5:
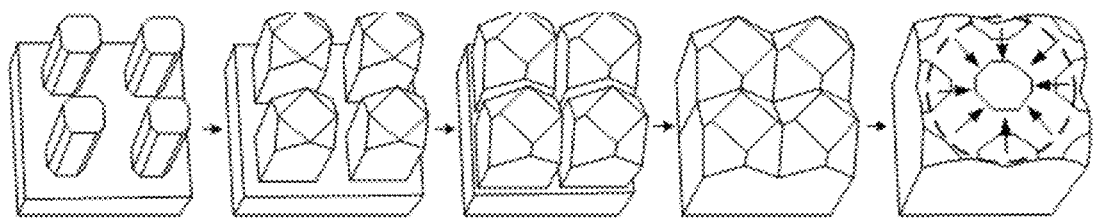
FIG. 5 schematically illustrate a diagram of a process for forming a doped epitaxial layer of the image sensor according to conventional technology.

Referring to FIG. 3 and FIG. 4, the view direction of FIG. 3 are the same as the view direction of FIG. 2, and FIG. 4 schematically illustrates a section diagram along the A-A line in FIG. 3. A doped epitaxial layer 105 is formed in the first trench 102, in the second trench 103 and in the cross trench 104. The first trench 102, the second trench 103 and the cross trench 104 are filled with the doped epitaxial layer 105, and the doped epitaxial layer 105 is doped with second ions. A conductivity of the second ions is different from a conductivity of the first ions.

In some embodiment of conventional technology, the substrate 100 is a silicon which has a crystal direction of <100>. A width d1 of the first trench 102 is smaller than a width d2 of the cross trench 104. A side wall of each of the plurality of columnar structures 101 perpendicular to the first direction a is a (100) crystal face, and an oblique section of each of the plurality of columnar structures 101 perpendicular to the third direction c is a (110) crystal face. During a process for forming the doped epitaxial layer in the first trench 102, in the second trench 103 and in the cross trench 104, the growth rate of the (110) crystal face is faster than the growth rate of the (100) crystal face. Therefore, it is easy to form a (111) crystal face at the upper part of the first trench 102 and at the upper part of the cross trench 104 (as shown in FIG. 4) when which are not full filled. Moreover, since the growth rate of the (111) crystal face is slower than that of the (110) crystal face and the (100) crystal face, with the continuous growth of the doped epitaxial layer, the growth rate along the third direction c is the fastest, the doped epitaxial layer merges from four directions. At the same time, the first trench 102 is gradually full filled to be merged, and finally the cross trench 104 is gradually full filled at the upper part thereof from eight directions (as shown in FIG. 5). According to the epitaxial mode of silicon, Si—Si atoms nucleated in a single layer and then piled up. The doped epitaxial layer subsequently grows on corresponding eight faces at different rates. When the first trench and the cross trench are finally full filled, the top (111) crystal face at the top part accumulates dislocations (as shown in Part B in FIG. 4).

When crystal lattices dislocation occurs, electric charges may be generated without light at some pixel points which are formed subsequently, which may accumulate to generate dark current. For a pixel unit, if a value of dark current in the pixel unit is greater than a value of the photocurrent generated by capturing photoelectrons, the pixel unit is considered as a white pixel which may affect the performance of the image sensor resulted.

On the basis of the aforementioned description, the present disclosure provides an image sensor and a method for forming the image sensor. According to some embodiments of the present disclosure, a side wall of each of a plurality of columnar structures perpendicular to the first direction is a (110) crystal face, and an oblique section of each of the plurality of columnar structures perpendicular to the third direction is a (100) crystal face. Therefore, during a process for forming the doped epitaxial layer, the growth rate of the doped epitaxial layer formed in the first trench is greater than the growth rate of the doped epitaxial layer formed in the cross trench, that is, the first trench is full filled earlier than the cross trench. Then, a "cylinder" structure is gradually formed in the cross trench with the doped epitaxial layer continually filling into the cross trench. The "cylinder" structure in the cross trench is thus gradually full filled without forming a (111) crystal face which is easy to accumulate and produce dislocations at an upper part of the cross trench. Therefore, the upper part of the cross trench can be improved with little defects after the cross trench is full filled, which can effectively reduce white pixels and thus improve the performance of the image sensor.

Various additional objects, features and beneficial effects of the present disclosure can be more fully appreciated with reference to the detailed description and accompanying drawings that follow.

FIG. 6 to FIG. 15 schematically illustrate intermediate structural diagrams according to a method for forming an image sensor in some embodiments of the present disclosure.

Figure 6:
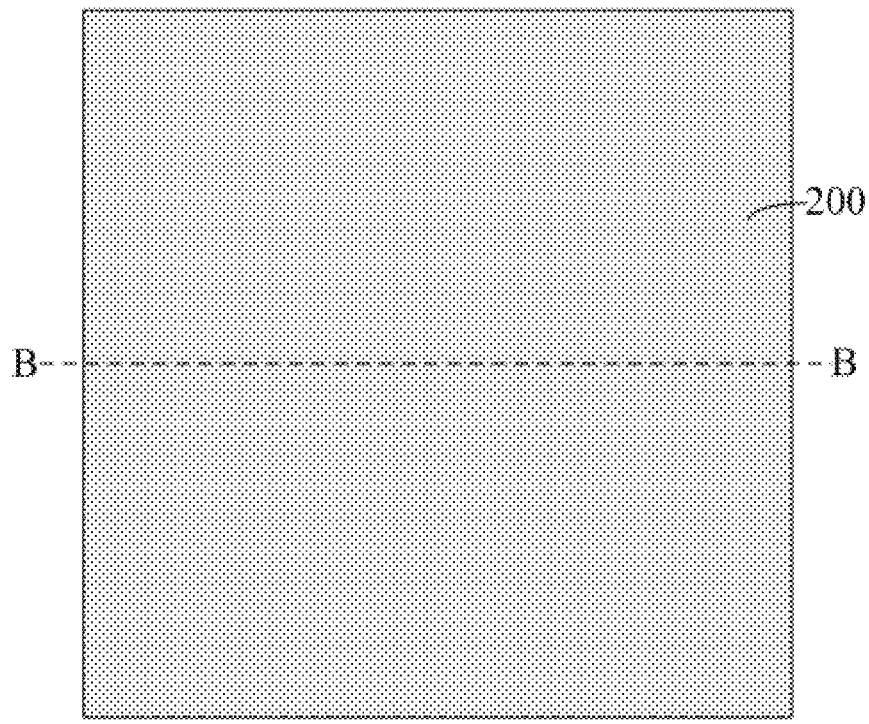
FIG. 6 to FIG. 15 schematically illustrate intermediate structural diagrams according to a method for forming an image sensor in some embodiments of the present disclosure.
Figure 7:
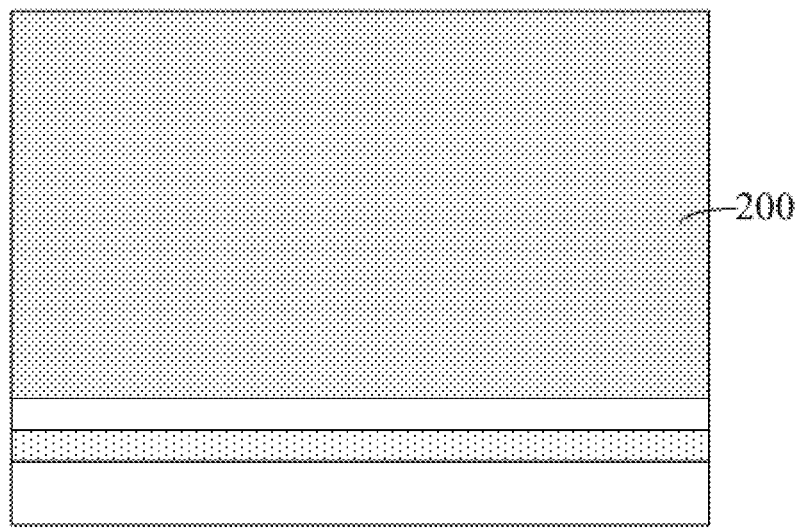

Referring to FIG. 6 and FIG. 7, FIG. 7 schematically illustrates a section diagram along the B-B line in FIG. 6. A substrate 200 doped with first ions is provided.

In some embodiment of the present disclosure, the substrate 200 includes a base (not marked in figures), a first P-type epitaxial layer (not marked in figures) on the base, a first intrinsic epitaxial layer (not marked in figures) on the first P-type epitaxial layer, and an N-type epitaxial layer (not marked in figures) on the first intrinsic epitaxial layer.

It should be noted that the first ions doped in the substrate 200 are N-type ions which are also doped in the N-type epitaxial layer.

The N-type ions include phosphorus ions or arsenic ions. In some embodiment, the N-type ions are phosphorus ions.

In some embodiment, the base is made of silicon doped with P-type ions. In some other embodiment, the base may also be made of a material including germanium, silicon germanium, silicon carbide, gallium arsenide or indium gallide.

In some embodiment, the substrate 200 is made of monocrystal silicon, and a surface of the substrate 200 has a crystal direction of <110>.

Figure 8:
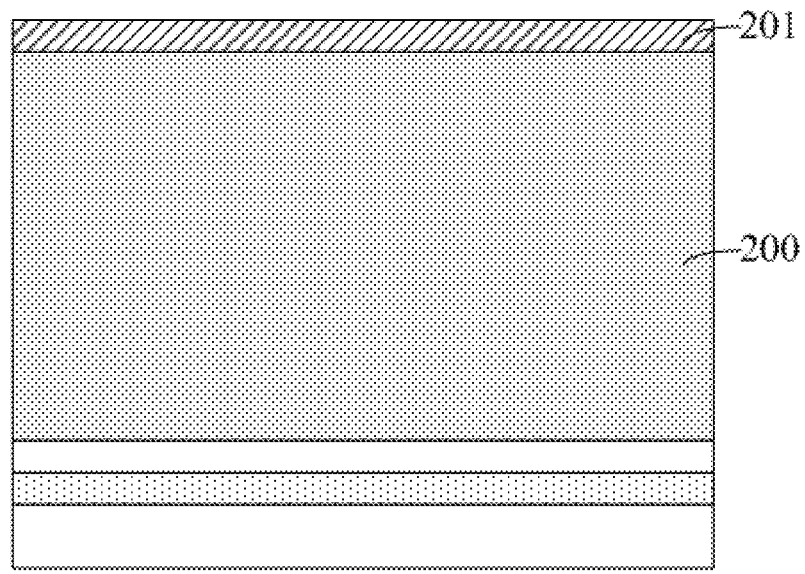

Referring to FIG. 8, the view direction of FIG. 8 are the same as the view directions of FIG. 2. A mask material layer 201 is formed on the substrate 200.

In some embodiment, the mask material layer 201 is a single layer structure, and the mask material layer 201 includes silicon oxide or silicon nitride.

In some embodiment, the mask material layer may also be a multi-layer structure which specifically includes a first mask material layer, a second mask material layer on the first mask material layer, and a third mask material layer on the second mask material layer. The first mask material layer and the third mask material layer are made of silicon oxide, and the second mask material layer is made of silicon nitride.

In some embodiment, a thickness of the mask material layer 201 ranges from 100 nm to 800 nm.

In some embodiment, the mask material layer 201 is different from a doped epitaxial layer subsequently formed in material, thus, the mask material layer can be used as a stop layer when the epitaxial material layer is subsequently planarized.

Figure 9:
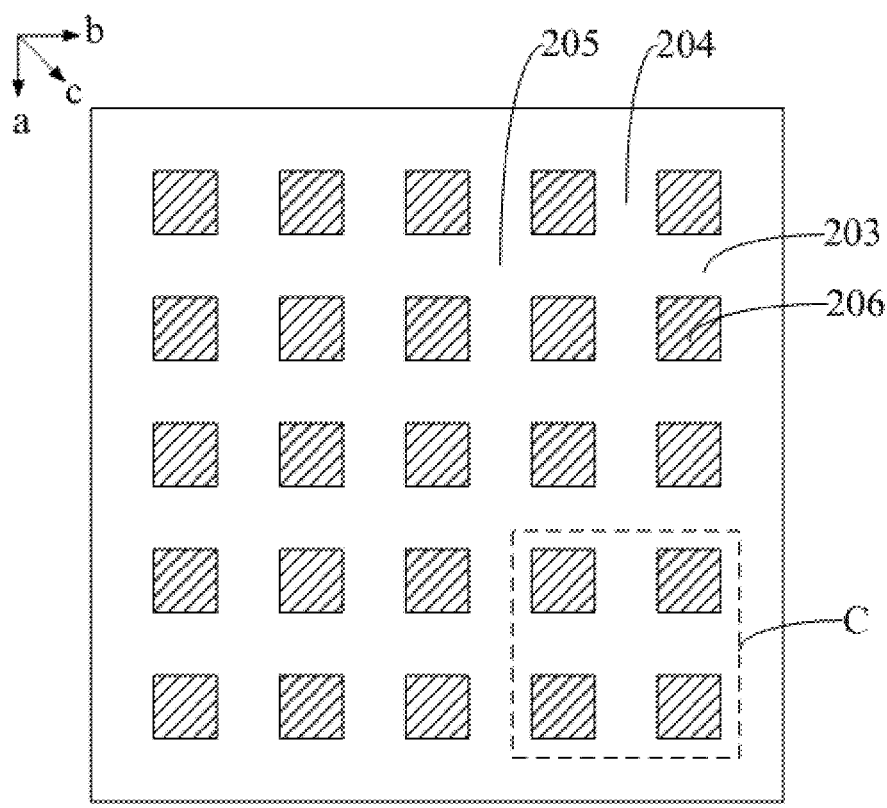
Figure 10:
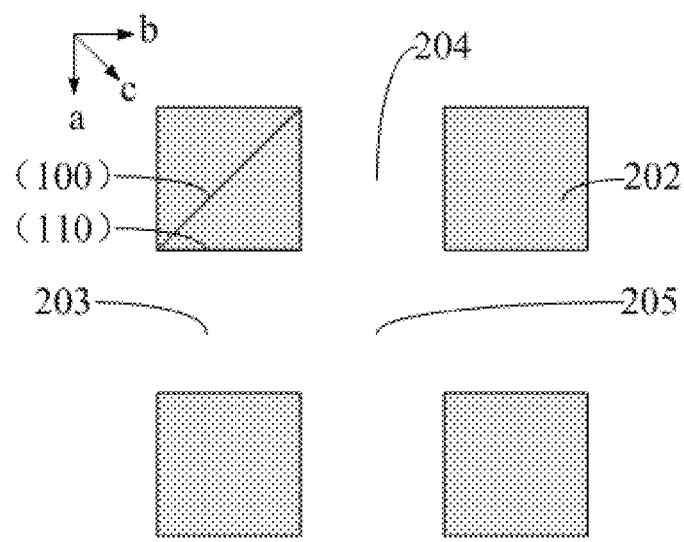

Referring to FIG. 9 and FIG. 10, FIG. 10 schematically illustrates a structural diagram of the Part C without a mask layer in FIG. 9. The substrate 200 is patterned to form a plurality of columnar structures 202 configured in an array. A first trench 203 is configured between adjacent columnar structures 202 which are configured along a first direction a, a second trench 204 is configured between adjacent columnar structures 202 which are configured along a second direction b, and a cross trench 205 is configured between adjacent columnar structures 202 which are configured along a third direction c. The first direction a is perpendicular to the second direction b, an included angle between the third direction c and the first direction a is 45°, and an included angle between the third direction c and the second direction b is 45°. A side wall of each of the plurality of columnar structures 202 perpendicular to the first direction a is a (110) crystal face, and an oblique section of each of the plurality of columnar structures 202 perpendicular to the third direction c is a (100) crystal face.

In some embodiment, during a process for patterning the substrate 200, a part of the mask material layer 201 is etched to form the mask layer 206.

In some embodiment, a linewidth of the first trench 203 ranges from 0.3 μm to 0.5 μm, and a linewidth of the second trench 204 ranges from 0.3 μm to 0.5 μm.

In some embodiment, the first trench 203, the second trench 204 and the cross trench 205 are cleaned after they are formed, so as to remove residues formed in the first trench 203, the second trench 204 and the cross trench 205 during etching processes.

In some embodiment, a process for patterning the substrate 200 includes a wet etching process.

Figure 11:
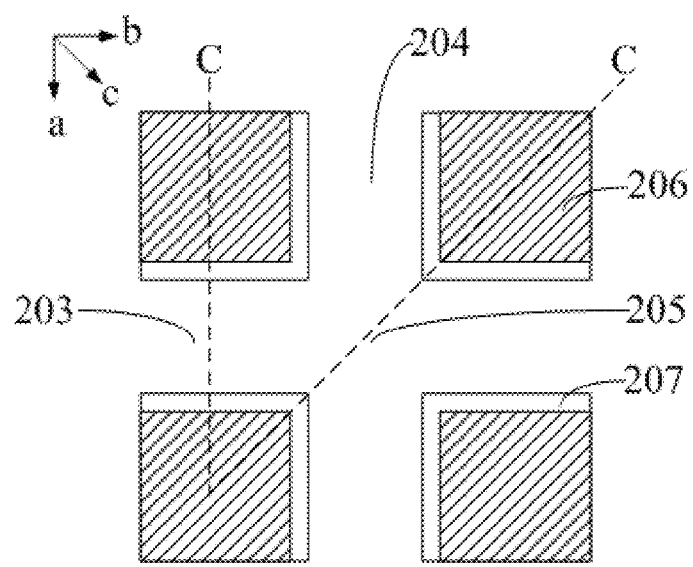
Figure 12:
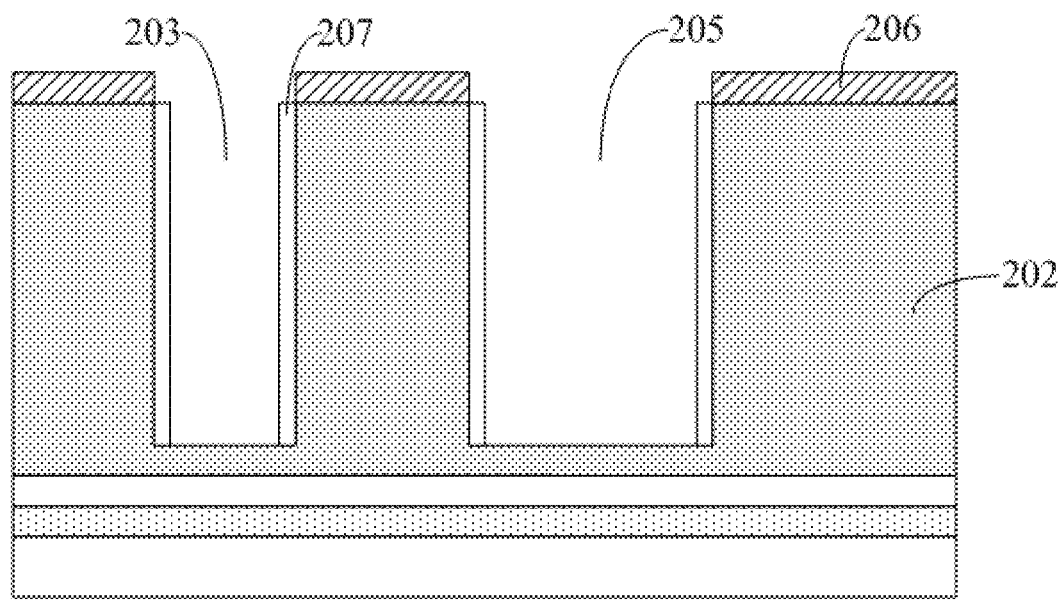

Referring to FIG. 11 and FIG. 12, FIG. 12 schematically illustrates a section diagram along the C-C line in FIG. 11. An intrinsic epitaxial layer 207 is formed on side walls of the first trench 203, the second trench 204 and the cross trench 205.

In some embodiment, the intrinsic epitaxial layer 207 may be used to repair defects on side walls of the first trench 203, the second trench 204 and the cross trench 205, which can improve the performance of the image sensor resulted.

In some embodiment, a process for forming the intrinsic epitaxial layer 207 includes an epitaxial growth process.

Figure 13:
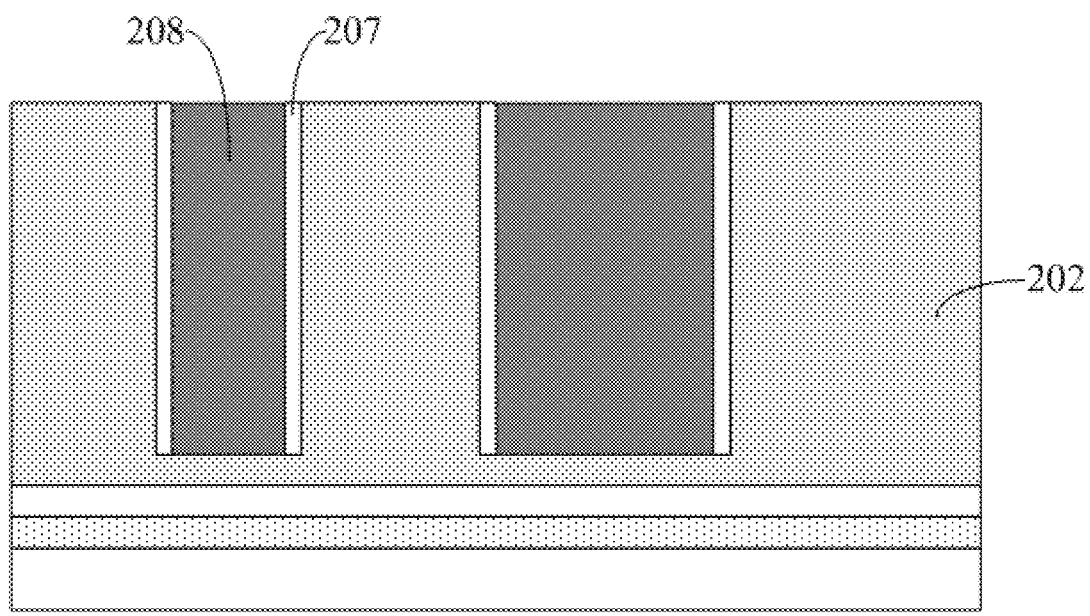

Referring to FIG. 13, the view direction of FIG. 13 are the same as the view direction of FIG. 12. A doped epitaxial layer 208 is formed in the first trench 203, the second trench 204 and the cross trench 205. The first trench 203, the second trench 204 and the cross trench 205 are filled with the doped epitaxial layer 208 which is doped with second ions. A conductivity of the second ions is different from a conductivity of the first ions.

Figure 14:
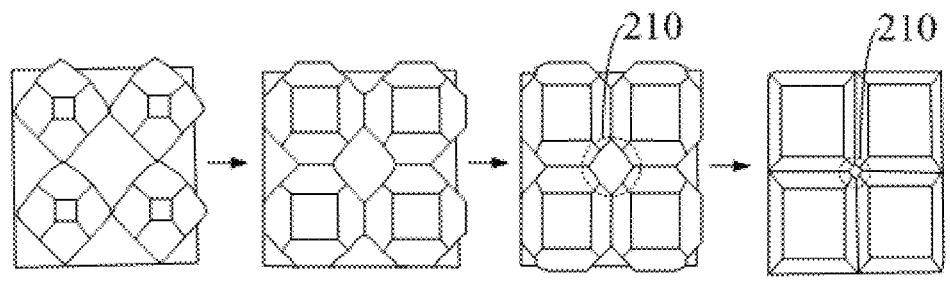

In some embodiment, a side wall of each of the plurality of columnar structures 202 perpendicular to the first direction a is a (110) crystal face, and the oblique section of each of the plurality columnar structures 202 perpendicular to the third direction c is a (100) crystal face. Therefore, during a process for forming the doped epitaxial layer 208, the growth rate of the doped epitaxial layer 208 formed in the first trench 203 is greater than the growth rate of the doped epitaxial layer 208 formed in the cross trench 205, that is, the first trench 203 is full filled earlier than the cross trench 205. Then, a "cylinder" structure is gradually formed in the cross trench 205 with the doped epitaxial layer 208 continually filling into the cross trench 205. The "cylinder" structure in the cross trench 205 is thus gradually full filled (a process for forming the doped epitaxial layer is shown in FIG. 14) without forming a (111) crystal face which is easy to accumulate and produce dislocations at an upper part of the cross trench 205. Therefore, the upper part of the cross trench can be improved with little defects after the cross trench 208 is full filled, which can effectively reduce white pixels and thus improve the performance of the image sensor.

It should be noted that, a crystal face of a side wall of each of the columnar structures 202 perpendicular to the second direction b and the (110) crystal face belong to a crystal system, and their growth rate are the same. Therefore, the second trench 204 is also full filled earlier than the cross trench 205.

In some embodiment, the doped epitaxial layer 208 is formed on the intrinsic epitaxial layer 207.

In some embodiment, forming the doped epitaxial layer 208 includes: forming an epitaxial material layer (not shown in figures) in the first trench 203, in the second trench 204, in the cross trench 205, and on the mask layer 206; conducting a first planarization on the epitaxial material layer to form an initial doped epitaxial layer (not shown in figures) until the surface of the mask layer 206 is exposed; removing the mask layer 206; and conducting a second planarization on the initial doped epitaxial layer to form the doped epitaxial layer 208 until a top surface of each of the plurality of columnar structures 202 is exposed.

In some embodiment, the first planarization includes a chemical mechanical planarization.

In some embodiment, the second planarization includes a chemical mechanical planarization.

In some embodiment, since a conductivity of the second ions is different from a conductivity of the first ions, both of the first ions and the second ions may diffuse. Therefore, a photodiode structure can be formed in the intrinsic epitaxial layer 207. Subsequently, the substrate 200 is irradiated by light to excite electrons, and the photodiode structure is used to form electrical signals from the excited electrons.

In some embodiment, the second ions include P-type ions.

The P-type ions include boron ions or indium ions. In some embodiment, the P-type ions are boron ions.

Figure 15:
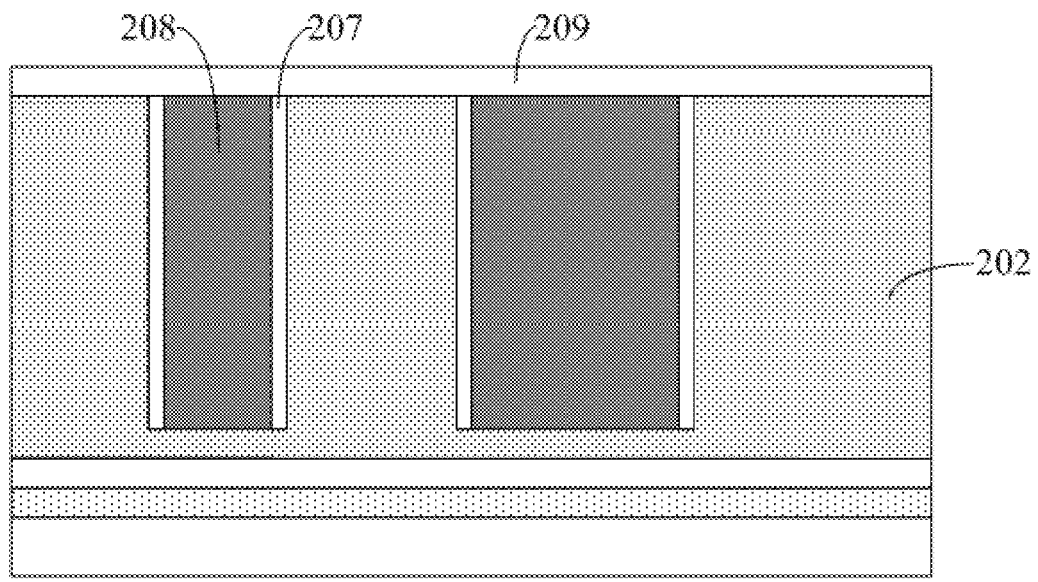

Referring to FIG. 15, after the doped epitaxial layer 208 is formed, a cover layer 209 is formed on the plurality of columnar structures 202 and on the doped epitaxial layer 208.

In some embodiment, forming the cover layer 209 includes: forming a cover material layer (not shown is figures) on the plurality of columnar structures 202 and on the doped epitaxial layer 208 through an epitaxial growth process; and conducting a third planarization on the cover material layer to form the cover layer 209.

In some embodiment, the third planarization includes a chemical mechanical planarization.

Accordingly, an image sensor is also provided by the present disclosure. Referring to FIG. 15, the image sensor includes: a substrate 200 doped with first ions, which includes a plurality of columnar structures 202 configured in an array, wherein a first trench 203 is configured between adjacent columnar structures 202 which are configured along a first direction a, a second trench 204 is configured between adjacent columnar structures 202 which are configured along a second direction b, a cross trench 205 is configured between adjacent columnar structures 202 which are configured along a third direction c, the first direction a is perpendicular to the second direction b, an included angle between the third direction c and the first direction a is 45°, an included angle between the third direction c and the second direction b is 45°, a side wall of each of the plurality of columnar structures 202 perpendicular to the first direction a is a (110) crystal face, and an oblique section of each of the plurality of columnar structures 202 perpendicular to the third direction c is a (100) crystal face; and a doped epitaxial layer 208 formed in the first trench 203, in the second trench 204 and in the cross trench 205, wherein the first trench 203, the second trench 204 and the cross trench 205 are filled with the doped epitaxial layer 208 which is doped with second ions, and a conductivity of the second ions is different from a conductivity of the first ions.

In some embodiment, a side wall of each of the plurality of columnar structures 202 perpendicular to the first direction a is a (110) crystal face, and the oblique section of each of the plurality columnar structures 202 perpendicular to the third direction c is a (100) crystal face. Therefore, during a process for forming the doped epitaxial layer 208, the growth rate of the doped epitaxial layer 208 formed in the first trench 203 is greater than the growth rate of the doped epitaxial layer 208 formed in the cross trench 205, that is, the first trench 203 is full filled earlier than the cross trench 205.

Then, a "cylinder" structure is gradually formed in the cross trench 205 with the doped epitaxial layer 208 continually filling into the cross trench 205. The "cylinder" structure in the cross trench 205 is gradually full filled (a process for forming the doped epitaxial layer is shown in FIG. 14) without forming a (111) crystal face which is easy to accumulate and produce dislocations at an upper part of the cross trench 205. Therefore, the upper part of the cross trench can be improved with little defects after the cross trench 208 is full filled, which can effectively reduce white pixels and thus improve the performance of the image sensor.

In some embodiment, the substrate 200 is made of monocrystal silicon, and a surface of the substrate 200 has a crystal direction of <110>.

In some embodiment, the image sensor further includes an intrinsic epitaxial layer 207 disposed on side walls of each of the plurality of columnar structures 202, and the doped epitaxial layer 208 is disposed on the intrinsic epitaxial layer 207. The intrinsic epitaxial layer 207 may be used to repair defects on side walls of the first trench 203, the second trench 204 and the cross trench 205, which can improve the performance of the image sensor resulted.

In some embodiment, the first ions are N-type ions, and the second ions are P-type ions.

In some embodiment, the image sensor further includes a cover layer 209 on the plurality of columnar structures 202 and on the doped epitaxial layer 208.

Although the present disclosure has been disclosed above, the present disclosure is not limited thereto. Those skilled in the art can modify and vary the embodiments without departing from the spirit and scope of the present disclosure. Therefore, the protection scope of the present disclosure should be based on the scope defined by the claims.

The invention claimed is:

1. A method for forming an image sensor, comprising:
providing a substrate which is doped with first ions;
patterning the substrate to form a plurality of columnar structures configured in an array, wherein a first trench is configured between adjacent columnar structures which are configured along a first direction, a second trench is configured between adjacent columnar structures which are configured along a second direction, a cross trench is configured between adjacent columnar structures which are configured along a third direction, the first direction is perpendicular to the second direction, an included angle between the third direction and the first direction is 45°, an included angle between the third direction and the second direction is 45°, a side wall of each of the plurality of columnar structures perpendicular to the first direction is a (110) crystal face, and an oblique section of each of the plurality of columnar structures perpendicular to the third direction is a (100) crystal face; and
forming a doped epitaxial layer in the first trench, in the second trench and in the cross trench, wherein the first trench, the second trench and the cross trench are filled with the doped epitaxial layer which is doped with second ions, and a conductivity of the second ions is different from a conductivity of the first ions.

2. The method according to claim 1, wherein the substrate is made of monocrystal silicon, and a surface of the substrate has a crystal direction of <110>.

3. The method according to claim 1, further comprising forming a mask material layer on the substrate before patterning the substrate, wherein patterning the substrate comprises etching the mask material layer to remove a part of the mask material layer so as to form a mask layer.

4. The method according to claim 3, wherein a thickness of the mask material layer ranges from 100 nm to 800 nm.

5. The method according to claim 3, wherein the mask layer is different from the doped epitaxial layer in material, and the mask layer comprises silicon oxide or silicon nitride.

6. The method according to claim 3, wherein forming the doped epitaxial layer comprises:
forming an epitaxial material layer in the first trench, in the second trench, in the cross trench, and on the mask layer;
conducting a first planarization on the epitaxial material layer to form an initial doped epitaxial layer until the surface of the mask layer is exposed;
removing the mask layer; and
conducting a second planarization on the initial doped epitaxial layer to form the doped epitaxial layer until a top surface of each of the plurality of columnar structures is exposed.

7. The method according to claim 6, wherein the first planarization comprises a chemical mechanical planarization.

8. The method according to claim 6, wherein the second planarization comprises a chemical mechanical planarization.

9. The method according to claim 1, further comprising forming an intrinsic epitaxial layer on side walls of each of the plurality of columnar structures before forming the doped epitaxial layer, wherein the doped epitaxial layer is formed on the intrinsic epitaxial layer.

10. The method according to claim 1, wherein the first ions are N-type ions, and the second ions are P-type ions.

11. The method according to claim 1, further comprising: after forming the doped epitaxial layer, forming a cover layer on the plurality of columnar structures and on the doped epitaxial layer.

12. The method according to claim 11, wherein forming the cover layer comprises:
forming a cover material layer on the plurality of columnar structures and on the doped epitaxial layer through an epitaxial growth process; and
conducting a third planarization on the cover material layer to form the cover layer.

13. The method according to claim 12, wherein the third planarization comprises a chemical mechanical planarization.

14. An image sensor, comprising:
a substrate doped with first ions, which comprises a plurality of columnar structures configured in an array, wherein a first trench is configured between adjacent columnar structures which are configured along a first direction, a second trench is configured between adjacent columnar structures which are configured along a second direction, a cross trench is configured between adjacent columnar structures which are configured along a third direction, the first direction is perpendicular to the second direction, an included angle between the third direction and the first direction is 45°, an included angle between the third direction and the second direction is 45°, a side wall of each of the plurality of columnar structures perpendicular to the first direction is a (110) crystal face, and an oblique section of each of the plurality of columnar structures perpendicular to the third direction is a (100) crystal face; and a doped epitaxial layer formed in the first trench, in the second trench and in the cross trench, wherein the first trench, the second trench and the cross trench are filled with the doped epitaxial layer which is doped with second ions, and a conductivity of the second ions is different from a conductivity of the first ions.

15. The image sensor according to claim 14, wherein the substrate is made of monocrystal silicon, and a surface of the substrate has a crystal direction of <110>.

16. The image sensor according to claim 14, further comprising an intrinsic epitaxial layer disposed on side walls of each of the plurality of columnar structures, wherein the doped epitaxial layer is disposed on the intrinsic epitaxial layer.

17. The image sensor according to claim 14, wherein the first ions are N-type ions, and the second ions are P-type ions.

18. The image sensor according to claim 14, further comprising a cover layer on the plurality of columnar structures and on the doped epitaxial layer.

* * * * *